US010285300B1

(12) United States Patent
Mao

(10) Patent No.: US 10,285,300 B1
(45) Date of Patent: May 7, 2019

(54) TRAY MECHANISM AND CASING MODULE THEREOF

(71) Applicant: Wistron Corporation, New Taipei (TW)

(72) Inventor: Zhong-Hui Mao, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/027,271

(22) Filed: Jul. 4, 2018

(30) Foreign Application Priority Data

Apr. 16, 2018 (CN) .......................... 2018 1 0338761

(51) Int. Cl.
*H05K 7/14* (2006.01)
(52) U.S. Cl.
CPC ......... *H05K 7/1489* (2013.01); *H05K 7/1411* (2013.01)
(58) Field of Classification Search
CPC ... H05K 7/1485; H05K 7/1487; H05K 7/1489
USPC ................................................ 361/724–728
See application file for complete search history.

(56) References Cited

U.S. PATENT DOCUMENTS

| | | | | |
|---|---|---|---|---|
| 5,641,296 | A * | 6/1997 | Larabell | G06F 1/184 439/157 |
| 9,826,658 | B1 * | 11/2017 | Mao | H05K 7/1487 |
| 2004/0120123 | A1 * | 6/2004 | Mayer | H05K 7/1489 361/725 |
| 2005/0257232 | A1 * | 11/2005 | Hidaka | G11B 33/126 720/654 |
| 2006/0290245 | A1 * | 12/2006 | Hidaka | H05K 7/1489 312/223.1 |
| 2008/0068788 | A1 * | 3/2008 | Ozawa | H04Q 1/02 361/679.43 |
| 2010/0007255 | A1 * | 1/2010 | Cheng | H05K 7/1489 312/334.44 |
| 2012/0281373 | A1 * | 11/2012 | Bohannon | H05K 7/1489 361/756 |
| 2016/0157377 | A1 * | 6/2016 | Nishiyama | H05K 7/1489 361/679.58 |

\* cited by examiner

*Primary Examiner* — Adrian S Wilson
(74) *Attorney, Agent, or Firm* — Winston Hsu

(57) ABSTRACT

A tray mechanism for accommodating an electronic device in a casing having first and second side plates includes a sheet, a pin, a lock rod, a push rod, a tray having a bottom plate and third and fourth side plates, and a fixing plate disposed on the bottom plate. The pin is disposed on the sheet and is movable on the fixing plate. The lock rod and the push rod are slidably arranged on the fixing plate. The pin penetrates through a slot of the lock rod. A hook of the push rod releasably hooks the pin. When a block of the second side plate biases the push rod to separate the hook from the pin, the push rod pushes the pin to slide upward to retract the lock rod inwardly to separate an abutting end of the lock rod from a holding sheet of the first side plate.

18 Claims, 13 Drawing Sheets

TRAY MECHANISM AND CASING MODULE THEREOF

BACKGROUND OF THE INVENTION

1. Field of the Invention

The present disclosure relates to a tray mechanism and a casing module thereof, and more specifically, to a tray mechanism configured to accommodate an electronic device, and to mount the electronic device on a casing and on a casing module thereof.

2. Description of the Prior Art

In general, in a conventional server assembly process, related server components are mounted (e.g. display card modules and mainboard modules) on a tray and the tray is disposed into a server casing from a top of the server casing. As such, the server assembly process can be completed.

However, during the conventional server assembly process of mounting the tray into the server casing, the tray may easily be oblique relative to the server casing, causing jamming between side plates of the tray and the server casing. Therefore, an operator needs to repeatedly adjust the mounting position of the tray relative to the server casing to make sure that the tray is parallel with a bottom of the server casing when the tray is mounted into the server casing, which may cause the tray assembly process to be time-consuming and strenuous accordingly.

SUMMARY OF THE INVENTION

The present disclosure provides a tray mechanism for accommodating at least one electronic device, wherein the at least one electronic device is mounted in a casing via the tray mechanism. The casing includes a first side plate and a second side plate opposite to the first side plate. The first side plate has a first holding sheet. The second side plate has a first block. The tray mechanism includes a tray, a fixing plate, a sheet, a pin, a first lock rod, and a first push rod. The tray has a bottom plate, a third side plate, and a fourth side plate. The third side plate and the fourth side plate are disposed at two sides of the bottom plate respectively for accommodating the at least one electronic device cooperatively with the bottom plate. The fixing plate is disposed on the bottom plate. The sheet is slidably disposed on the fixing plate. The pin is disposed on the sheet, and the pin is configured to move upward and downward between a lock position and a release position relative to the fixing plate. The first lock rod is disposed on the fixing plate in an obliquely slidable manner. The first lock rod has a first abutting end and a first slot end. The first abutting end protrudes from the third side plate. The pin is disposed through the first slot end. The first push rod is disposed on the fixing plate in a transversely slidable manner. The first push rod has a first hook end and a first protruding-block end. A first inclined-surface structure and a first hook are formed on the first hook end. The first hook extends from the first inclined-surface structure to releasably hook the pin. The first protruding-block end protrudes from the fourth side plate. When the first block biases the first protruding-block end to retract the first push rod inwardly relative to the fourth side plate to separate the first hook from the pin, the first inclined-surface structure pushes the pin upward to the release position for driving the first lock rod to slide obliquely via the first slot end, to retract the first abutting end inwardly relative to the third side plate to be separate from the first holding sheet.

The present disclosure further provides a casing module for accommodating at least one electronic device. The casing module includes a casing and a tray mechanism. The casing includes a first side plate and a second side plate opposite to the first side plate. The first side plate has a first holding sheet. The second side plate has a first block. The tray mechanism includes a tray, a fixing plate, a sheet, a pin, a first lock rod, and a first push rod. The tray has a bottom plate, a third side plate, and a fourth side plate. The third side plate and the fourth side plate are disposed at two sides of the bottom plate respectively for accommodating the at least one electronic device cooperatively with the bottom plate. The fixing plate is disposed on the bottom plate. The sheet is slidably disposed on the fixing plate. The pin is disposed on the sheet, and the pin is configured to move upward and downward between a lock position and a release position relative to the fixing plate. The first lock rod is disposed on the fixing plate in an obliquely slidable manner. The first lock rod has a first abutting end and a first slot end. The first abutting end protrudes from the third side plate. The pin is disposed through the first slot end. The first push rod is disposed on the fixing plate in a transversely slidable manner. The first push rod has a first hook end and a first protruding-block end. A first inclined-surface structure and a first hook are formed on the first hook end. The first hook extends from the first inclined-surface structure to releasably hook the pin. The first protruding-block end protrudes from the fourth side plate. When the first block biases the first protruding-block end to retract the first push rod inwardly relative to the fourth side plate to separate the first hook from the pin, the first inclined-surface structure pushes the pin upward to the release position for driving the first lock rod to slide obliquely via the first slot end, to retract the first abutting end inwardly relative to the third side plate to be separate from the first holding sheet.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
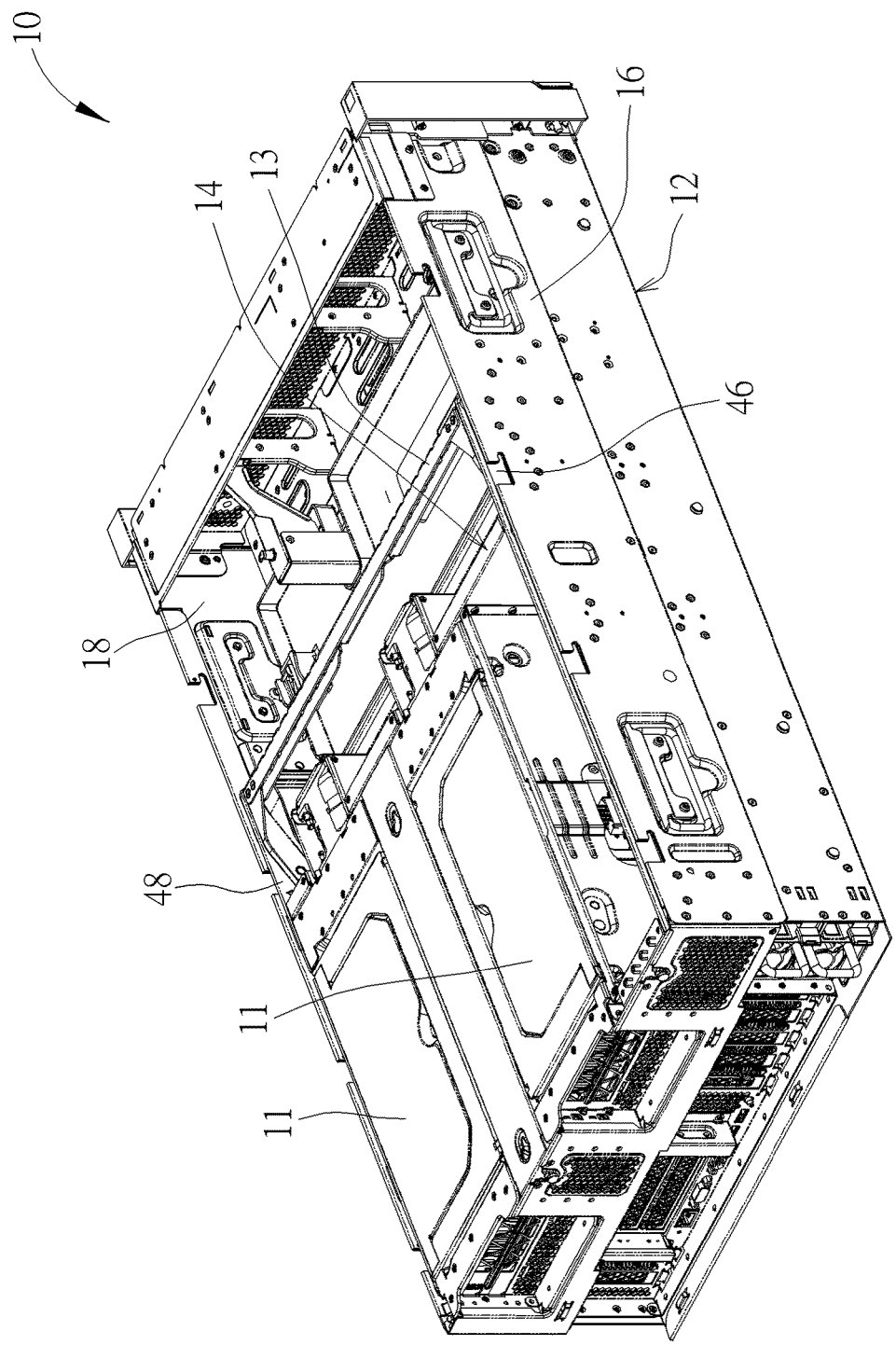
FIG. 1 is an assembly diagram of a casing module according to an embodiment of the present disclosure.

Please refer to FIGS. 1-6. A casing module 10 includes a casing 12 and a tray mechanism 14. The casing 12 includes a first side plate 16 and a second side plate 18 opposite to the first side plate 16. The first side plate 16 has a first holding sheet 20 and a second block 22, and the second side plate 18 has a first block 24 and a second holding sheet 26. In one example, the first holding sheet 20 and the second holding sheet 26 may be bent from the first side plate 16 and the second side plate 18 for holding the tray mechanism 14, but the present disclosure is not limited thereto.

Figure 4:
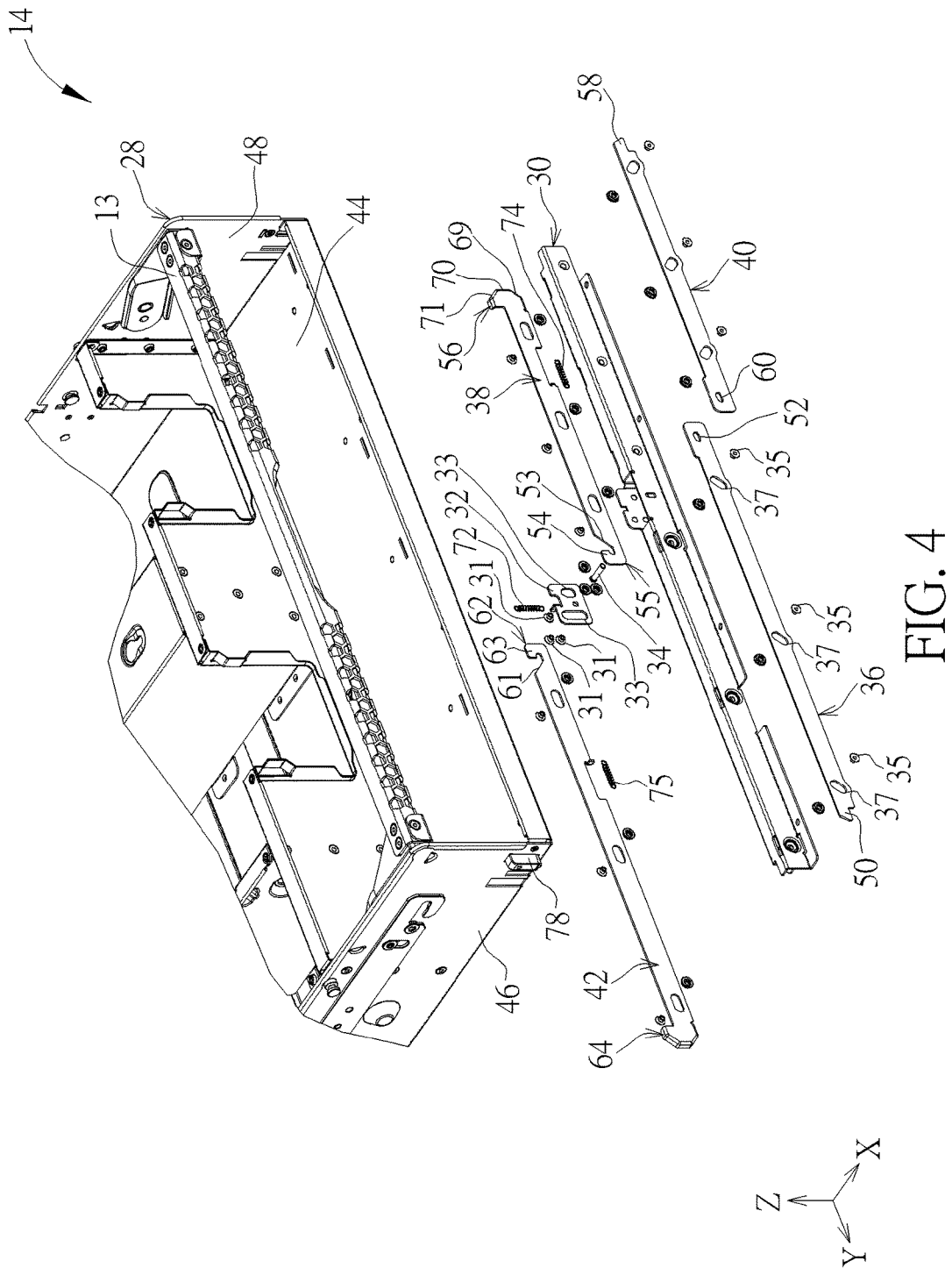
FIG. 4 is an exploded diagram of the tray mechanism in FIG. 2.

As shown in FIG. 1 and FIG. 4, the tray mechanism 14 includes a tray 28, a fixing plate 30, a sheet 32, a pin 34, a first lock rod 36, a first push rod 38, a second lock rod 40, and a second push rod 42. The tray 28 has a bottom plate 44, a third side plate 46, and a fourth side plate 48. The third side plate 46 and the fourth side plate 48 are disposed at two sides of the bottom plate 44 respectively for accommodating at least one electronic device 11 (for example, the electronic devices may be display card modules, and, as shown in FIG. 1, two electronic devices are accommodated, but the present disclosure is not limited thereto) cooperatively with the bottom plate 44. The fixing plate 30 is disposed on the bottom plate 44 (e.g. by rivets). The sheet 32 is slidably disposed on the fixing plate 30, and the pin 34 is disposed on the sheet 32 (e.g. by inserting the pin 34 into the sheet 32 or by an integral forming process). In this embodiment, the sheet 32 could have at least one sliding slot 33 (for example, the sheet 32 may include two sliding slots 33 as shown in FIG. 4, but the present disclosure is not limited thereto), and the fixing plate 30 could have a sliding structure 31 corresponding to the sliding slot 33. In one example, the sliding structure 31 may be a T-shaped rivet pillar slidably disposed through the sliding slot 31 (but the present disclosure is not limited thereto, that is, the present disclosure could adopt other sliding design, such as the sliding design that the sliding structure could be a sliding block disposed through the sliding slot), such that the sheet 32 may slide upward and downward relative to the fixing plate 30. Such that, the pin 34 disposed on the sheet 32 may move between a lock position and a release position along a "Z" direction, as shown in FIG. 4, relative to the fixing plate 30.

Figure 2:
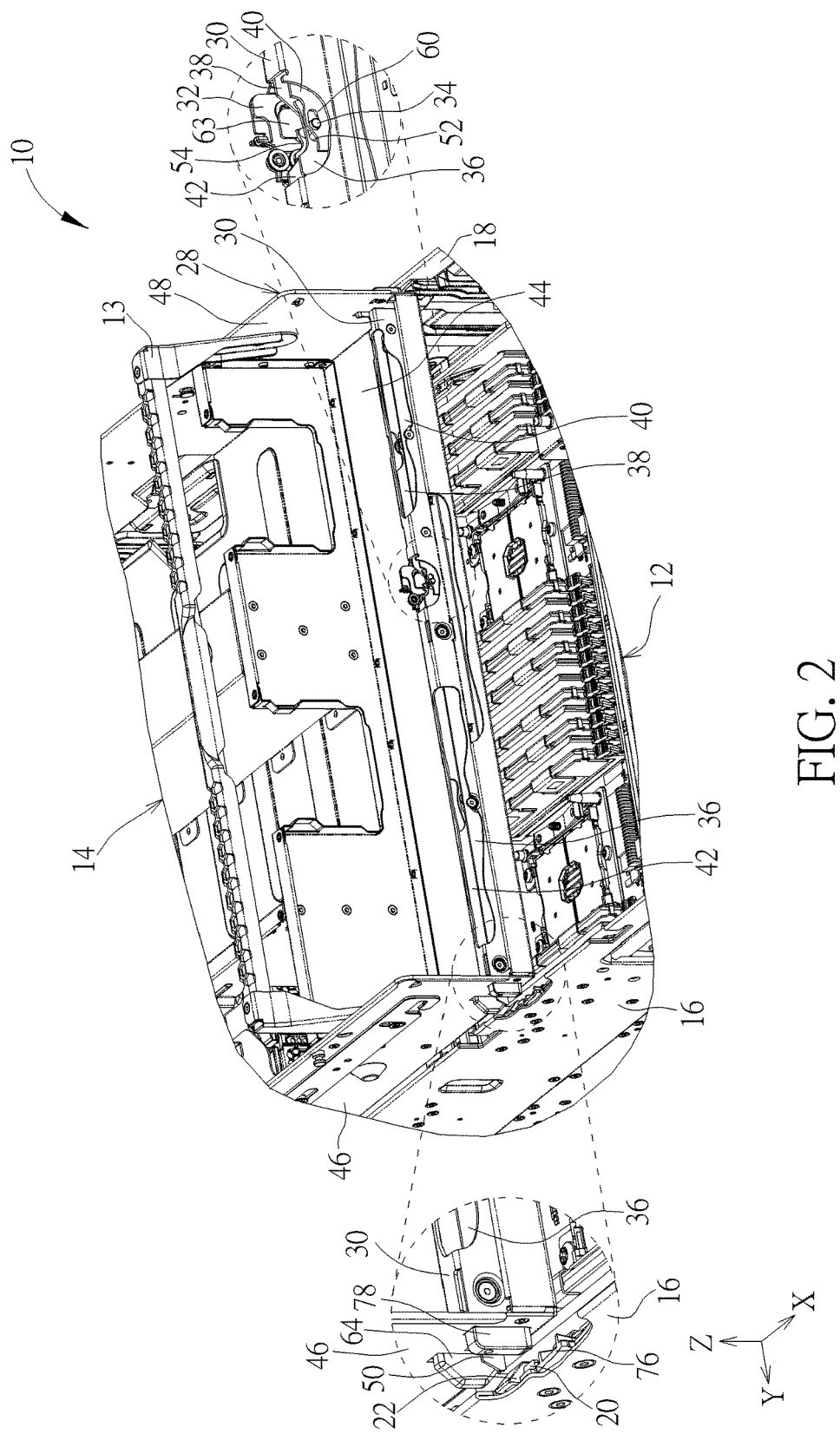
FIG. 2 is a partial enlarged diagram illustrating a tray mechanism in FIG. 1 has not been mounted in a casing.
Figure 3:
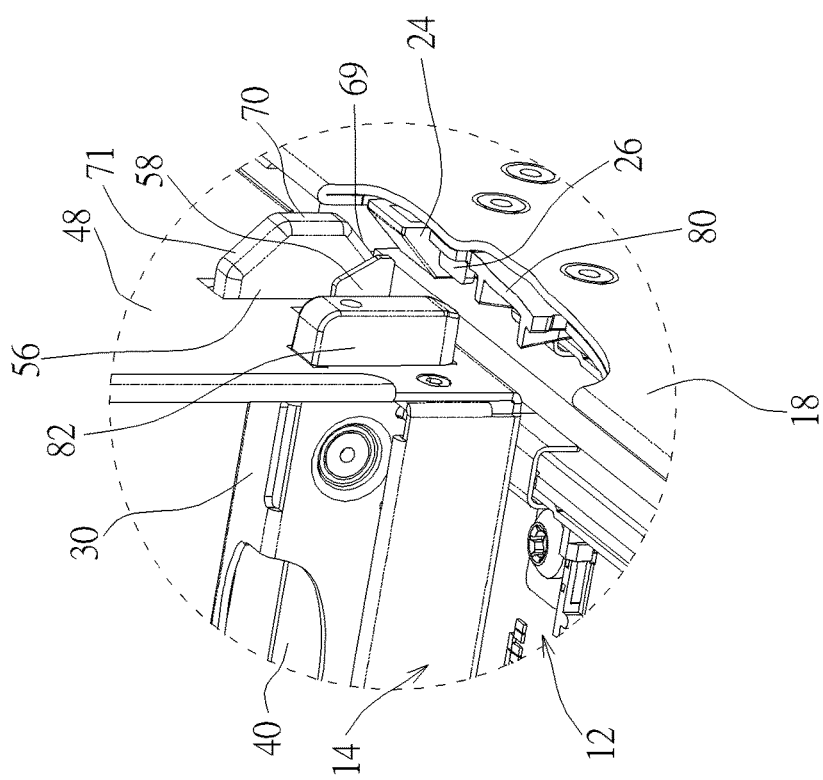
FIG. 3 is a partial enlarged diagram of a tray and the casing in FIG. 2 from another viewing angle.

The first lock rod 36 is disposed on the fixing plate 30 in an obliquely slidable manner and has a first abutting end 50 and a first slot end 52. The first push rod 38 is disposed on the fixing plate 30 in a transversely slidable manner and has a first hook end 55 and a first protruding-block end 56. The second lock rod 40 is disposed on the fixing plate 30 in an obliquely slidable manner and has a second abutting end 58 and a second slot end 60. The second push rod 42 is disposed on the fixing plate 30 in a transversely slidable manner and has a second hook end 62 and a second protruding-block end 64. A first inclined-surface structure 53 and a first hook 54 are formed on the first hook end 55, and a second inclined-surface structure 61 and a second hook 63 are formed on the second hook end 62. To be more specific, as shown in FIG. 2, FIG. 3, and FIG. 4, the first abutting end 50 and the second protruding-block end 64 protrude from the third side plate 46 respectively, and the second abutting end 58 and the first protruding-block end 56 protrude from the fourth side plate 48 respectively. Furthermore, the pin 34 is disposed through the first slot end 52 and the second slot end 60 respectively, and the first hook 54 and the second hook 63 extend from the first inclined-surface structure 53 and the second inclined-surface structure 61 respectively. In such a manner, the first hook 54 and the second hook 63 can releasably hook the pin 34 for constraining movement of the pin 34 in the XYZ directions as shown in FIG. 2.

In this embodiment, the present disclosure may adopt the pillar-to-slot sliding design to slidably dispose the first lock rod 36, the first push rod 38, the second lock rod 40, and the second push rod 42 on the fixing plate 30. However, the present disclosure is not limited thereto, that is, the present disclosure could adopt other sliding design in another embodiment, such as the block-to-slot sliding design. For example, as shown in FIG. 4, the tray mechanism 14 may include at least one T-shaped pillar 35 (for example, as shown in FIG. 4, the tray mechanism 14 may utilize three T-shaped pillars 35, but the present disclosure is not limited thereto) disposed through a corresponding oblique slot 37 on the first lock rod 36 and fixed to the fixing plate 30 (e.g. by rivets or screws). In such a manner, when the T-shaped pillar 35 slides along the oblique slot 37, the first lock rod 36 can slide obliquely on the fixing plate 30, such that the first abutting end 50 may protrude from the third side plate 46 or retract inwardly relative to the third side plate 46. The aforesaid sliding design could be also applied to the first push rod 38, the second lock rod 40, and the second push rod 42, such that the first push rod 38 and the second push rod 42 may slide transversely relative to the fixing plate 30 and the second lock rod 40 may slide obliquely relative to the fixing plate 30. The related description could be reasoned by analogy according to the aforesaid description and omitted herein.

Figure 5:
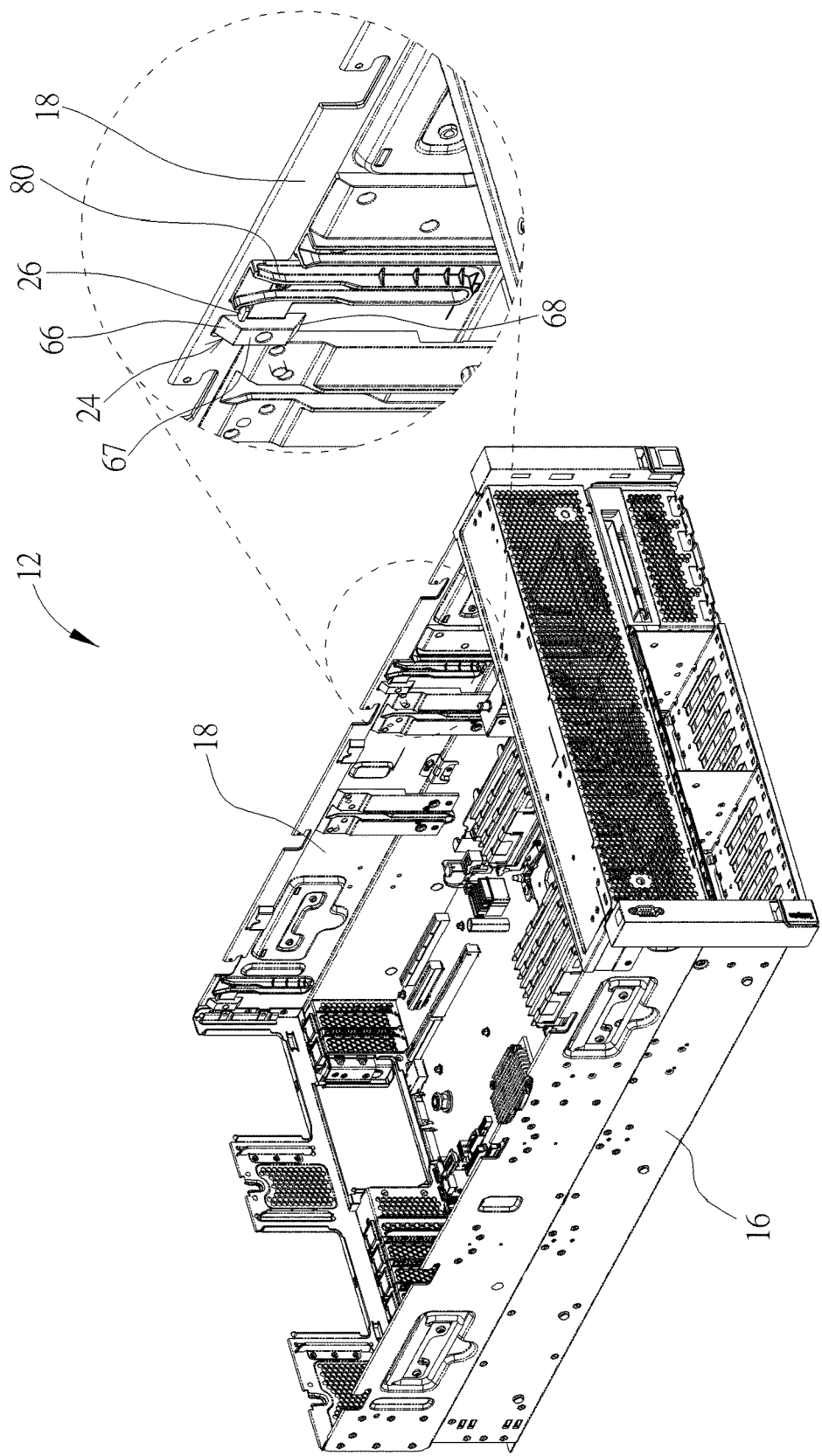
FIG. 5 is a diagram of the casing in FIG. 2.
Figure 6:
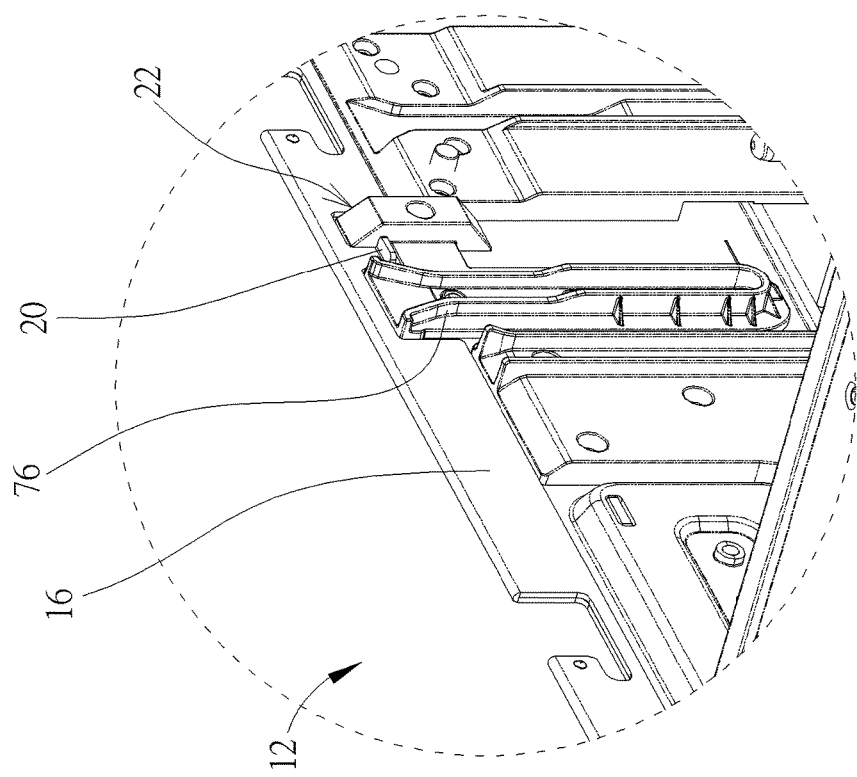
FIG. 6 is a partial enlarged diagram of the casing in FIG. 5 from another viewing angle.

In practical application, for preventing the first protruding-block end 56 from being interfered with the first block 24 so that the first protruding-block end 56 could be biased by the first block 24 smoothly, the present disclosure could adopt the surface-to-surface sliding design. For example, as shown in FIG. 3 and FIG. 5, in this embodiment, the first block 24 could have a first oblique surface 66, a first vertical surface 67, and a third oblique surface 68, and the first protruding-block end 56 could have a second oblique surface 69, a second vertical surface 70, and a fourth oblique surface 71 respectively corresponding to the first oblique surface 66, the first vertical surface 67, and the third oblique surface 68. The first vertical surface 67 extends from the first oblique surface 66 downward to the third oblique surface 68. The second vertical surface 70 extends from the second oblique surface 69 upward to the fourth oblique surface 71. In such a manner, via surface-to-surface sliding between the first oblique surface 66 and the second oblique surface 69, surface-to-surface sliding between the first vertical surface 67 and the second vertical surface 70, and surface-to-surface sliding between the third oblique surface 68 and the fourth oblique surface 71, the first protruding-block end 56 could be biased smoothly by the first block 24 to retract the first push rod 38 inwardly relative to the fourth side plate 48, or the first protruding-block end 56 could be misaligned with the first block 24 to protrude the first push rod 38 from the fourth side plate 48 during the assembly process of the casing module 10. The aforesaid surface-to-surface sliding design could be also applied to the second block 22 and the second protruding-block end 64, and the related description could be reasoned by analogy according to the aforesaid description and omitted herein. To be noted, in another embodiment, the present disclosure could only adopt the surface-to-surface sliding design of the first oblique surface 66 and the second oblique surface 69, or could only adopt the surface-to-surface sliding design of the first oblique surface 66 and the second oblique surface 69 and the surface-to-surface sliding design of the first vertical surface 67 and the second vertical surface 70, such that the first protruding-block end 56 can be only biased by the first block 24 without being released during the assembly process of the casing module 10 so as to simplify the mechanical design of the present disclosure.

Furthermore, in one example, the first push rod 38 and the second push rod 42 could be moved back to their original positions automatically. However, the present disclosure is not limited thereto, that is, the pin 34, the first push rod 38, and the second push rod 42 could be pushed back to their original positions manually in another embodiment (e.g. pushing the first push rod 38 to its original position via a push button formed thereon). For example, as shown in FIG. 4, the tray mechanism 14 could further include a first spring 72 and second springs 74 and 75. The first spring 72 is connected to the sheet 32 and the fixing plate 30. The first spring 72 is configured to drive the pin 34 and the sheet 32 back to the lock position. The second spring 74 is connected to the first push rod 38 and the fixing plate 30. The second spring 74 is configured to drive the first push rod 38 back to its original position, and the first protruding-block end 56 may protrude from the fourth side plate 48. The second spring 75 is connected to the second push rod 42 and the fixing plate 30. The second spring 75 is configured to drive the second push rod 42 back to its original position, and the second protruding-block end 64 may protrude from the third side plate 46.

Moreover, as shown in FIG. 2, FIG. 3, FIG. 5, and FIG. 6, the first side plate 16 could further have a positioning rail 76, and a positioning block 78 could be formed on the third side plate 46 corresponding to the positioning rail 76. The second side plate 18 could further have a positioning rail 80, and a positioning block 82 could be formed on the fourth side plate 48 corresponding to the positioning rail 80. Accordingly, during the process of assembling the tray 28 with the casing 12, the positioning block 78 slides along the positioning rail 76 to abut against a bottom of the positioning rail 76 and the positioning block 82 slides along the positioning rail 80 to abut against a bottom of the positioning rail 80, so as to guide the tray 28 to be positioned in the casing 12 precisely. In practical application, for further improving operational convenience of the tray mechanism 14, as shown in FIG. 2, the tray mechanism 14 could further include at least one handle 13 (for example, as shown in FIG. 2, the tray mechanism 14 may further include one handle 13, but the present disclosure is not limited thereto). The handle 13 is pivoted to the third side plate 46 and the fourth side plate 48 of the tray 28 respectively. As such, the user may lift the tray mechanism 14 steadily by holding the handle 13, and the subsequent assembly operation between the tray mechanism 14 and the casing 12 may be performed.

Figure 7:
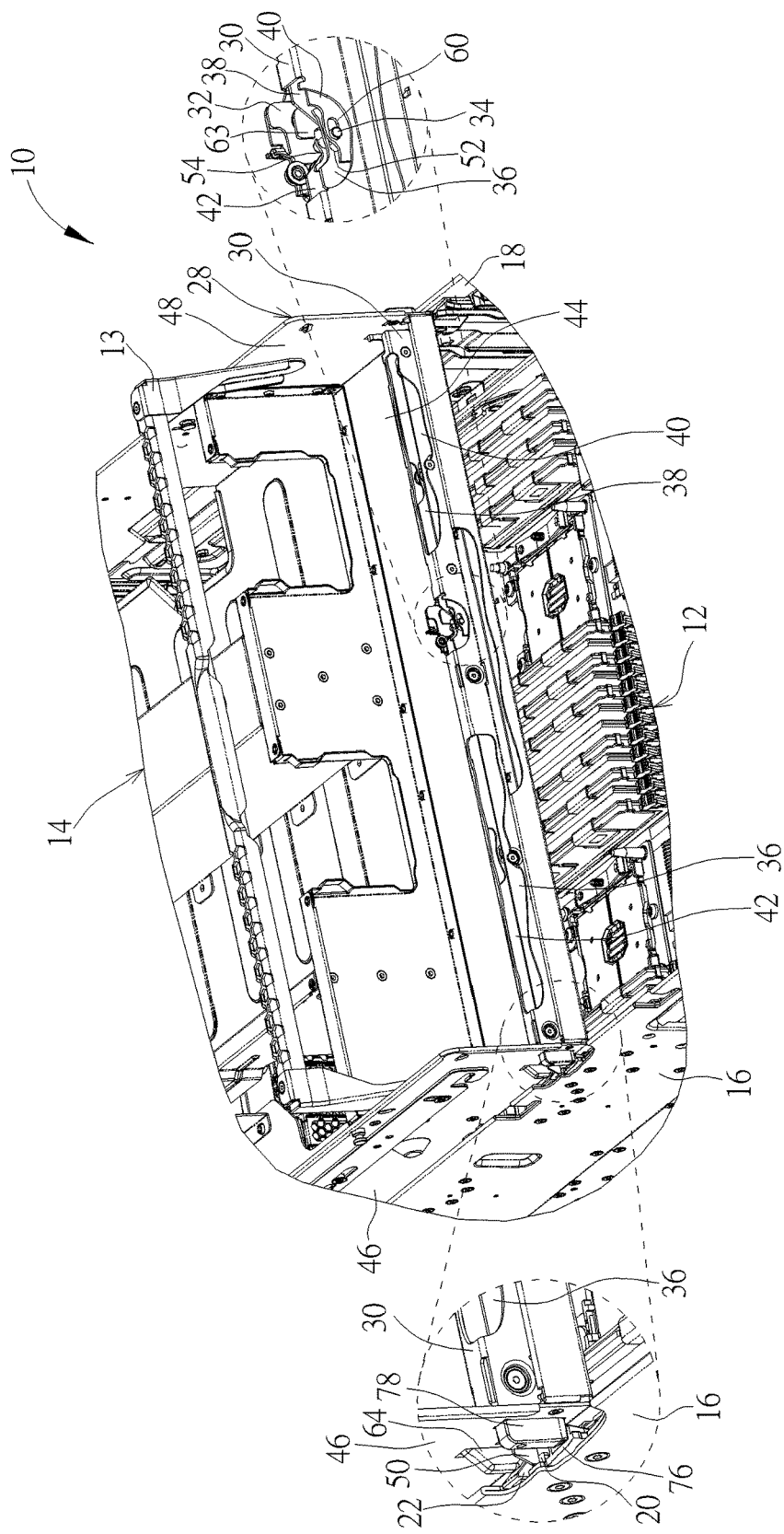
FIG. 7 is a partial enlarged diagram illustrating the tray mechanism in FIG. 2 moving relative to the casing to abut a first abutting end against a first holding sheet.

More detailed description for the assembly process of the casing module 10 is provided as follows. Please refer to FIG. 2 and FIGS. 7-13. First, when the user wants to perform the assembly operation of the casing module 10, the user just needs to hold the handle 13 and lift the tray mechanism 14 having the electronic device 11 disposed thereon to be located above the casing 12 (as shown in FIG. 2, the first hook 54 and the second hook 63 hook the pin 34 cooperatively at the lock position), and then abuts the first abutting end 50 protruding from the third side plate 46 against the first holding sheet 20 on the first side plate 16 (the tray mechanism 14 is tilted toward the first side plate 16 relative to the casing 12 as shown in FIG. 7). Simultaneously, the second protruding-block end 64 is biased by the second block 22, and the second push rod 42 may retract inwardly relative to the third side plate 46. Accordingly, the second hook 63 is separate from the pin 34, the first abutting end 50 abuts against the first holding sheet 20 steadily, and the first hook 54 still hooks the pin 34. As such, the first abutting end 50 is unable to retract inwardly.

Figure 8:
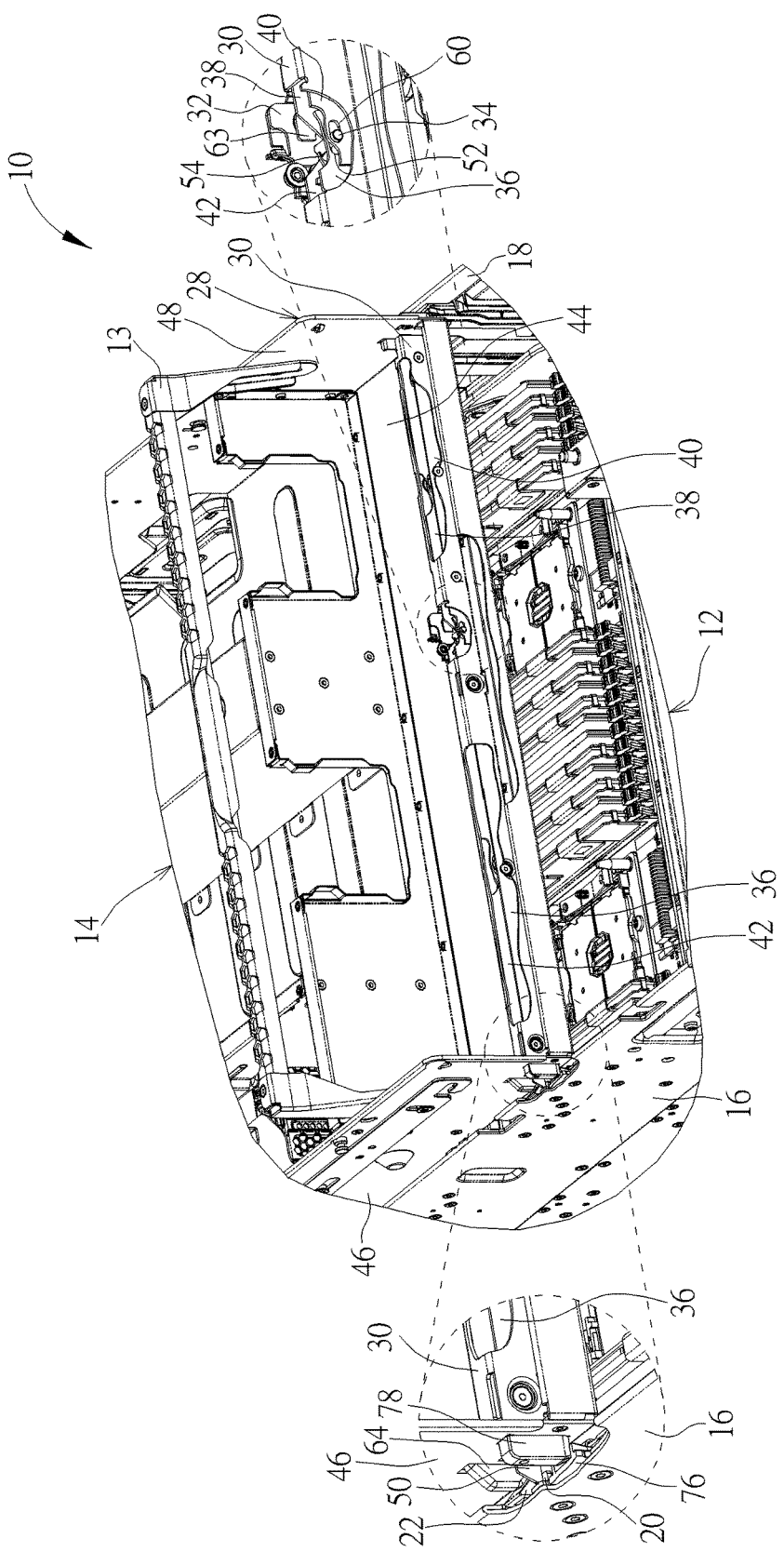
FIG. 8 is a partial enlarged diagram illustrating the tray mechanism in FIG. 7 moving relative to the casing to separate a second hook from a pin.
Figure 9:
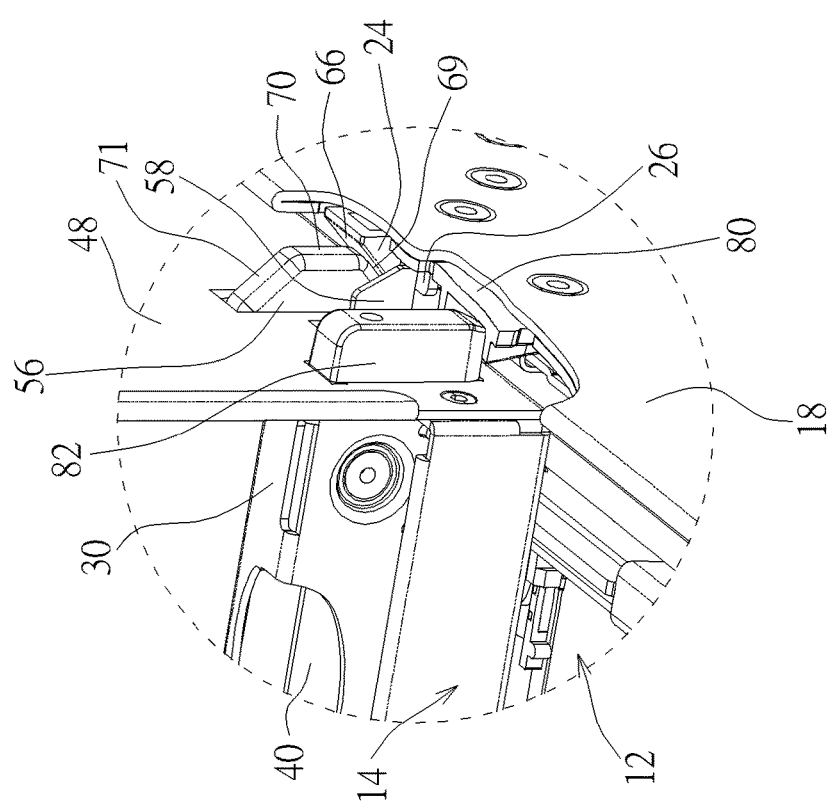
FIG. 9 is a partial enlarged diagram of the tray mechanism and the casing in FIG. 8.
Figure 10:
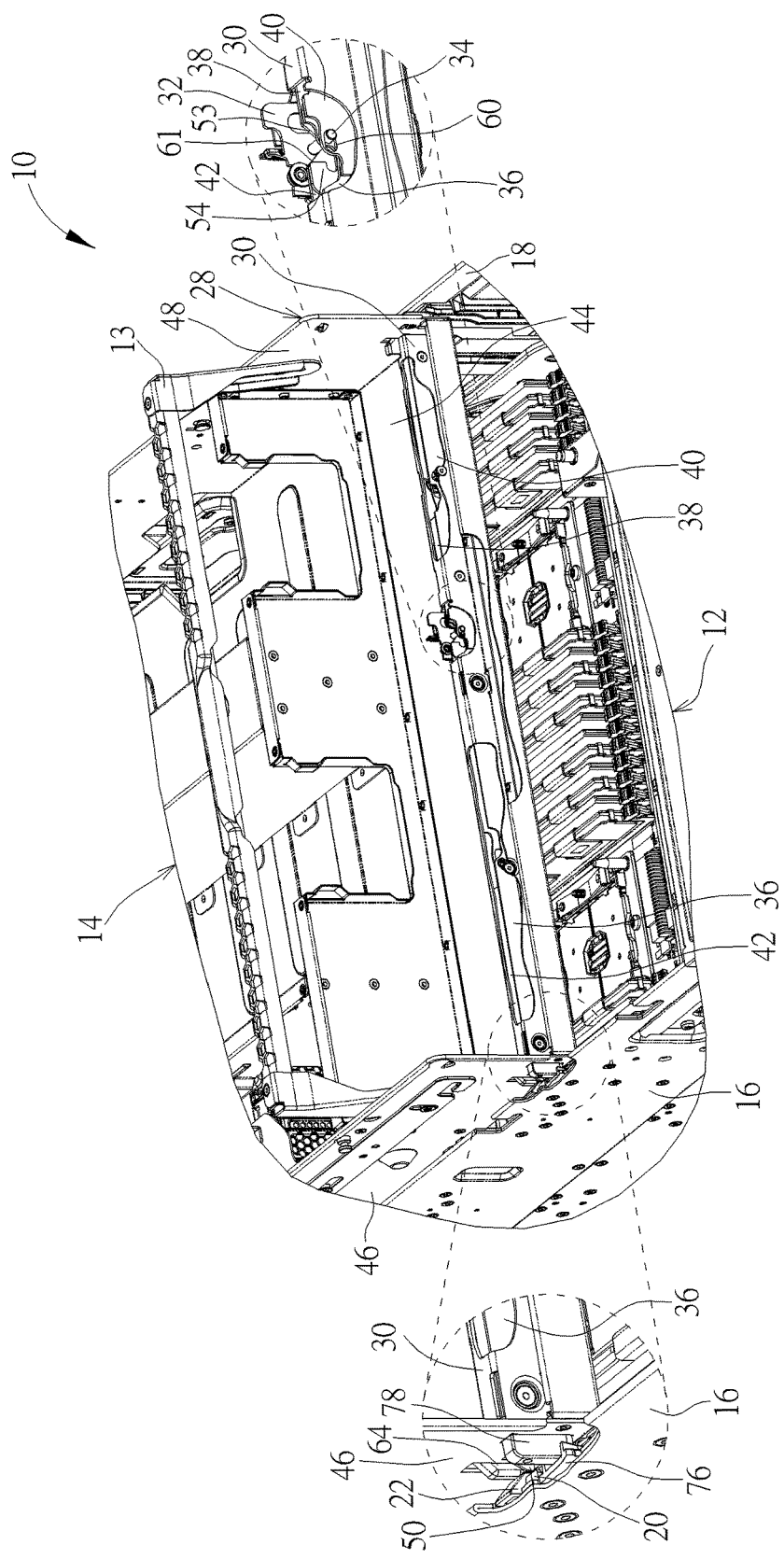
FIG. 10 is a partial enlarged diagram illustrating the tray mechanism in FIG. 8 being mounted into the casing.
Figure 11:
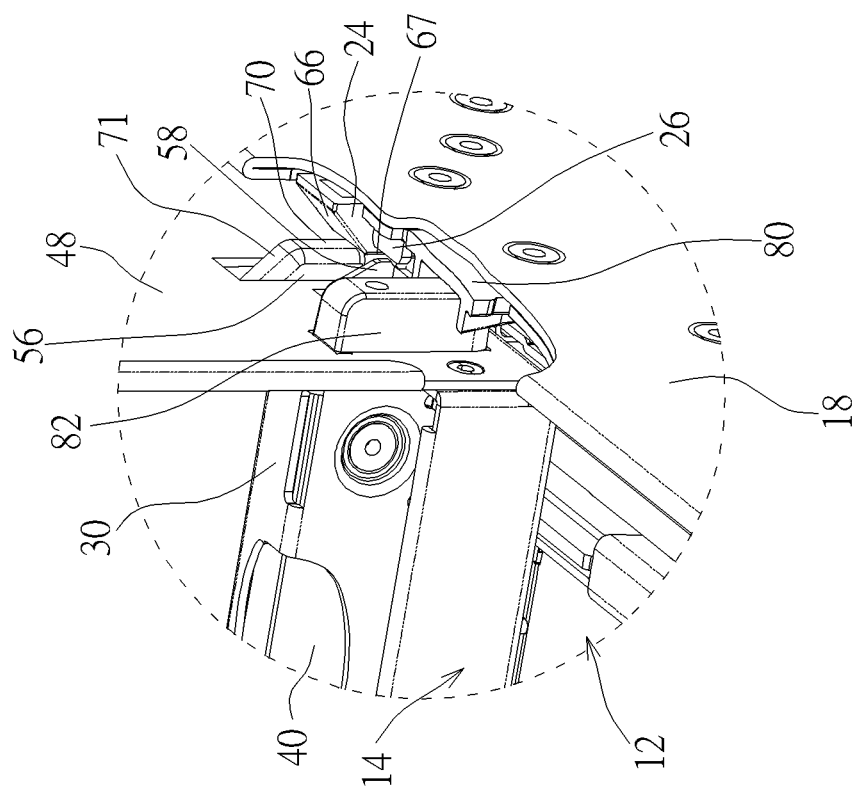
FIG. 11 is a partial enlarged diagram of the tray mechanism and the casing in FIG. 10 from another viewing angle.

Subsequently, the user could adjust the tray mechanism 14 from a tilted state as shown in FIG. 7 to a horizontal state relative to the casing 12 as shown in FIG. 8 for abutting the second abutting end 58 protruding from the fourth side plate 48 against the second holding sheet 26 of the second side plate 18 (as shown in FIG. 9). During the aforesaid process, via surface-to-surface sliding between the first oblique surface 66 and the second oblique surface 69 as shown in FIG. 9, the first protruding-block end 56 is biased by the first block 24 to retract inwardly relative to the fourth side plate 48, and the first hook 54 may be separated from the pin 34. In such a manner, since the pin 34 is no longer hooked by the first hook 54 and the second hook 63 as shown in FIG. 8, the first protruding-block end 56 can be further biased by the first block 24 (via surface-to-surface sliding between the first vertical surface 67 and the second vertical surface 70 as shown in FIG. 11) and the second protruding-block end 64 can be further biased by the second block 22 (as shown in FIG. 10), so as to retract the first push rod 38 inwardly relative to the fourth side plate 48 and to retract the second push rod 42 inwardly relative to the third side plate 46. As such, the pin 34 can be pushed by the first inclined-surface structure 53 and the second inclined-surface structure 61 from a position as shown in FIG. 8 upward to the release position as shown in FIG. 10.

During the aforesaid process of sliding the pin 34 upward to the release position as shown in FIG. 10, the pin 34 is disposed through the first slot end 52 and the second slot end 60 respectively, the pin 34 can drive the first lock rod 36 and the second lock rod 40 to retract inwardly relative to the third side plate 46 and the fourth side plate 48, so as to separate the first abutting end 50 and the second abutting end 58 from the first holding sheet 20 and the second holding sheet 26 respectively. In such a manner, since the first abutting end 50 no longer abuts against the first holding sheet 20 and the second abutting end 58 no longer abuts against the second holding sheet 26, the user can mount the tray mechanism 14, as shown in FIG. 10, into the casing 12 until the positioning block 78 slides along the positioning rail 76 to abut against the bottom of the positioning rail 76 and the positioning block 82 slides along the positioning rail 80 to abut against the bottom of the positioning rail 80, such that the tray mechanism 14 can be mounted in the casing 12 steadily, as shown in FIG. 1.

Figure 12:
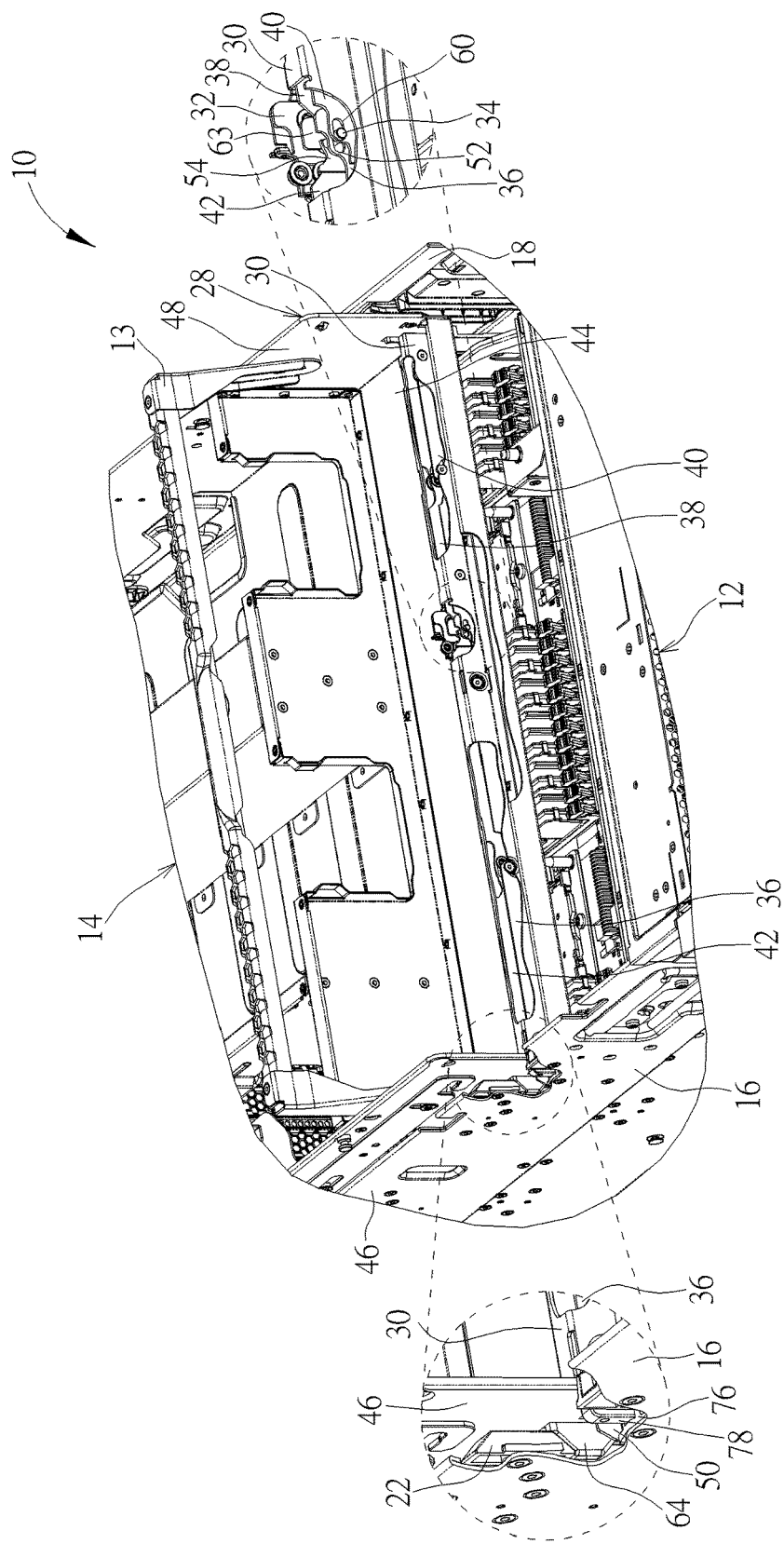
FIG. 12 is a partial enlarged diagram illustrating the tray mechanism in FIG. 10 being mounted into the casing to misalign a second block with a second protruding-block end.
Figure 13:
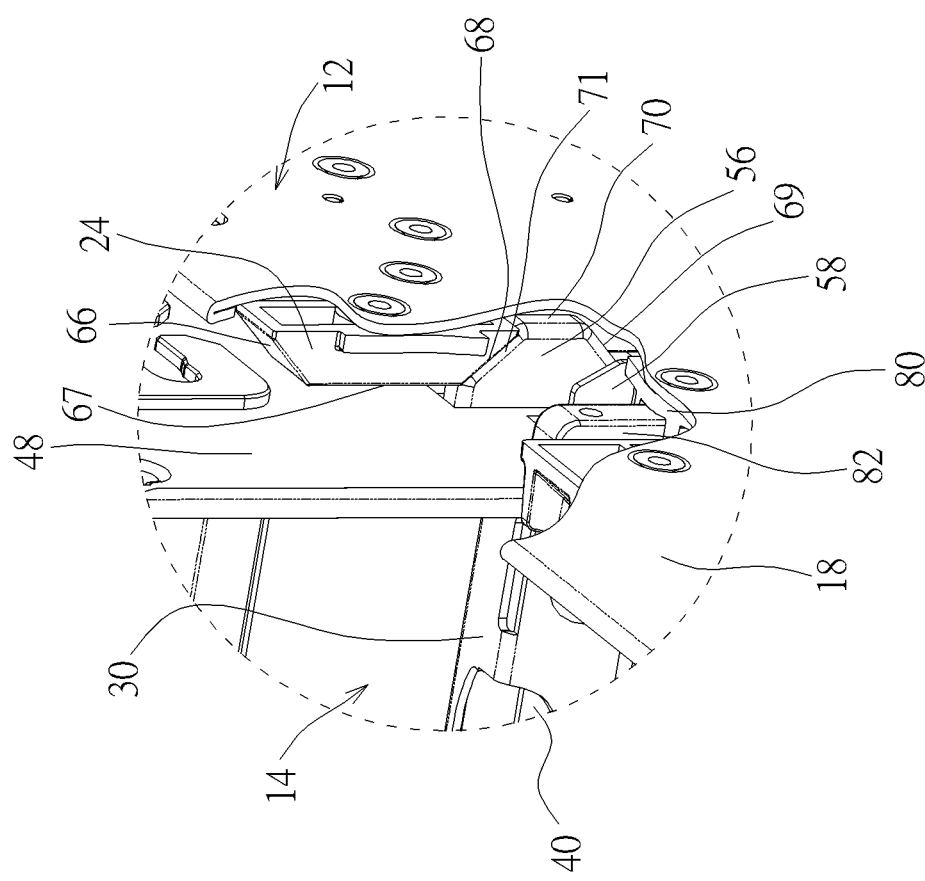
FIG. 13 is a partial enlarged diagram of the tray mechanism and the casing in FIG. 12 from another viewing angle.

To be noted, during the aforesaid process of mounting the tray mechanism 14 into the casing 12, as shown in FIG. 12 and FIG. 13, via inclined-surface contact between the protruding-block end of the push rod and the block of the side plate (e.g. surface-to-surface sliding between the third oblique surface 68 and the fourth oblique surface 70 as shown in FIG. 13) and the spring driving design, the first protruding-block end 56 and the second protruding-block end 64 can be misaligned with the first block 24 and the second block 22 respectively, so that the pin 34 can move back to the lock position automatically, and the first abutting end 50 and the second abutting end 58 can protrude from the third side plate 46 and the fourth side plate 48.

On the other hand, when the user wants to detach the tray mechanism 14 from the casing 12, the user just needs to hold the handle 13 to lift the tray mechanism 14 to a position, as shown in FIG. 2, where the tray mechanism 14 is completely separate from the casing 12, so as to complete the disassembly process of the casing module 10. During the aforesaid disassembly process, via the aforesaid surface-to-surface sliding designs, the first protruding-block end 56 and the second protruding-block end 64 can be biased by the first block 24 and the second block 22 to prevent the tray mechanism 14 from being interfered with the casing 12. Accordingly, the user can detach the tray mechanism 14 from the casing 12 quickly and smoothly without utilizing any auxiliary tool (e.g. a screw driver) and then subsequent replacement or maintenance operation of the electronic device 11 may be performed.

In addition, the linkage design including the sheet 32, the pin 34, the first lock rod 36, the first push rod 38, the second lock rod 40, and the second push rod 42 configured on the fixing plate 30 can efficiently improve operational flexibility of the tray mechanism 14. That is to say, the operation of abutting the tray mechanism 14 against the casing 12 is not limited to the aforesaid operation of abutting the first abutting end 50 protruding from the third side plate 46 against the first holding sheet 20 of the first side plate 16 (wherein the tray mechanism 14 is tilted toward the first side plate 16 relative to the casing as shown in FIG. 7). For example, the second abutting end 58 protruding from the forth side plate 48 may abut against the second holding sheet 26 of the second side plate 18, and the tray mechanism 14 may be adjusted, so as to abut the first abutting end 50 protruding from the third side plate 46 against the first holding sheet 20 of the first side plate 16. As for the related detailed description for the aforesaid assembly process, it could be reasoned by analogy according to the aforesaid description and omitted herein.

In summary, via the linkage design of the sheet, the pin, the first lock rod, the first push rod, the second lock rod, and the second push rod configured on the fixing plate, no matter the user abuts the first abutting end against the first holding sheet or abuts the second abutting end against the second holding sheet first, the present disclosure ensures that the tray mechanism can be mounted into the casing from up to down in parallel to the casing. In such a manner, after the operation of abutting the abutting ends of the tray mechanism against the holding sheets of the casing respectively, the user can mount the tray mechanism into the casing quickly and conveniently without utilizing any auxiliary tool (e.g. a screw driver) and without repeatedly adjusting the mounting position of the tray mechanism relative to the casing. Thus, the present disclosure can efficiently solve the problem in the prior art that the tray assembly process is time-consuming and strenuous, so as to greatly reduce complexity of assembly of the tray mechanism.

It should be mentioned that the second push rod and the second lock rod are omissible components for simplifying the mechanical design of the tray mechanism provided by the present disclosure. For example, in the embodiment that the second push rod and the second lock rod are omitted, the present disclosure only utilizes linkage among the first push rod, the first lock rod, and the pin to complete the assembly process of the casing module, and the related description could be reasoned by analogy according to the aforesaid embodiments. In brief, assuming that the user abuts the first abutting end of the first lock rod against the first holding sheet of the first side plate first, the user just needs to adjust the tray mechanism to make the first protruding-block end of the first push rod biased by the first block of the second side plate for releasing engagement between the first push rod and the pin. Accordingly, the user can continue mounting the tray mechanism into the casing smoothly to complete the assembly process of the casing module.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A tray mechanism for accommodating at least one electronic device, wherein the at least one electronic device is mounted in a casing via the tray mechanism, the casing comprises a first side plate and a second side plate opposite to the first side plate, the first side plate has a first holding sheet, the second side plate has a first block, and the tray mechanism comprises:

a tray having a bottom plate, a third side plate, and a fourth side plate, wherein the third side plate and the fourth side plate are disposed at two sides of the bottom plate respectively for accommodating the at least one electronic device cooperatively with the bottom plate;

a fixing plate disposed on the bottom plate;

a sheet slidably disposed on the fixing plate;

a pin disposed on the sheet, wherein the pin is configured to move upward and downward between a lock position and a release position relative to the fixing plate;

a first lock rod disposed on the fixing plate in an obliquely slidable manner, wherein the first lock rod has a first abutting end and a first slot end, the first abutting end protrudes from the third side plate, and the pin is disposed through the first slot end; and a first push rod disposed on the fixing plate in a transversely slidable manner, wherein the first push rod has a first hook end and a first protruding-block end, a first inclined-surface structure and a first hook are formed on the first hook end, the first hook extends from the first inclined-surface structure to releasably hook the pin, and the first protruding-block end protrudes from the fourth side plate;

wherein when the first block biases the first protruding-block end to retract the first push rod inwardly relative to the fourth side plate to separate the first hook from the pin, the first inclined-surface structure pushes the pin upward to the release position for driving the first lock rod to slide obliquely via the first slot end, to retract the first abutting end inwardly relative to the third side plate to be separate from the first holding sheet.

2. The tray mechanism of claim 1, wherein the first side plate has a second block, the second side plate further has a second holding sheet, and the tray mechanism further comprises:

a second lock rod disposed on the fixing plate in an obliquely slidable manner, wherein the second lock rod has a second abutting end and a second slot end, the second abutting end protrudes from the fourth side plate, and the pin is disposed through the second slot end; and a second push rod disposed on the fixing plate in a transversely slidable manner, wherein the second push rod has a second hook end and a second protruding-block end, a second inclined-surface structure and a second hook are formed on the second hook end, the second hook extends from the second inclined-surface structure to releasably hook the pin, and the second protruding-block end protrudes from the third side plate;

wherein when the first and second abutting ends abut against the first and second holding sheets respectively and the first and second blocks bias the first and second protruding-block ends respectively, the first and second hooks are separate from the pin, the first and second inclined-surface structures push the pin upward to the release position to drive the first and second lock rods to slide obliquely, and the first and second abutting ends retract inwardly to be separate from the first and second holding sheets.

3. The tray mechanism of claim 1, wherein the first block has a first oblique surface, a second oblique surface is formed on the first protruding-block end corresponding to the first oblique surface, and when the first block biases the first protruding-block end, the first protruding-block end slides along the first oblique surface via the second oblique surface, and the first push rod retracts inwardly relative to the fourth side plate.

4. The tray mechanism of claim 3, wherein the first block further has a first vertical surface extending downward from the first oblique surface, a second vertical surface is formed on the first protruding-block end corresponding to the first vertical surface, and when the first protruding-block end retracts inwardly relative to the fourth side plate and the first vertical surface abuts against the second vertical surface, the first inclined-surface structure pushes the pin to the release position.

5. The tray mechanism of claim 4, wherein the first block further has a third oblique surface extending downward from the first vertical surface, a fourth oblique surface is formed on the first protruding-block end corresponding to the third oblique surface, and when the first protruding-block end slides along the third oblique surface via the fourth oblique surface, the first push rod protrudes from the fourth side plate.

6. The tray mechanism of claim 1 further comprising:
a first spring connected to the sheet and the fixing plate for driving the sheet to move the pin to the lock position.

7. The tray mechanism of claim 6 further comprising:
a second spring connected to the first push rod and the fixing plate for moving the first push rod back to its original position to protrude the first protruding-block end from the fourth side plate.

8. The tray mechanism of claim 1, wherein the first side plate further has a positioning rail, a positioning block is formed on the third side plate corresponding to the positioning rail, and when the first abutting end retracts inwardly and is separate from the first holding sheet, the tray is configured to move downward into the casing, and the positioning block slides along the positioning rail to abut against a bottom of the positioning rail for positioning the tray in the casing.

9. The tray mechanism of claim 1, wherein the sheet has at least one sliding slot, a sliding structure is formed on the fixing plate corresponding to the at least one sliding slot, and the sliding structure is slidably disposed through the at least one sliding slot to guide the sheet to slide upward and downward relative to the fixing plate.

10. A casing module for accommodating at least one electronic device, the casing module comprising:

a casing comprising a first side plate and a second side plate opposite to the first side plate, wherein the first side plate has a first holding sheet, and the second side plate has a first block; and a tray mechanism comprising:
a tray having a bottom plate, a third side plate, and a fourth side plate, wherein the third side plate and the fourth side plate are disposed at two sides of the bottom plate respectively for accommodating the at least one electronic device cooperatively with the bottom plate;
a fixing plate disposed on the bottom plate;
a sheet slidably disposed on the fixing plate;
a pin disposed on the sheet, wherein the pin is configured to move upward and downward between a lock position and a release position relative to the fixing plate;
a first lock rod disposed on the fixing plate in an obliquely slidable manner, wherein the first lock rod has a first abutting end and a first slot end, the first abutting end protrudes from the third side plate, and the pin is disposed through the first slot end; and
a first push rod disposed on the fixing plate in a transversely slidable manner, wherein the first push rod has a first hook end and a first protruding-block end, a first inclined-surface structure and a first hook are formed on the first hook end, the first hook extends from the first inclined-surface structure to releasably hook the pin, and the first protruding-block end protrudes from the fourth side plate;

wherein when the first block biases the first protruding-block end to retract the first push rod inwardly relative to the fourth side plate to separate the first hook from the pin, the first inclined-surface structure pushes the pin upward to the release position for driving the first lock rod to slide obliquely via the first slot end, to retract the first abutting end inwardly relative to the third side plate to be separate from the first holding sheet.

11. The casing module of claim 10, wherein the first side plate has a second block, the second side plate further has a second holding sheet, and the tray mechanism further comprises:

a second lock rod disposed on the fixing plate in an obliquely slidable manner, wherein the second lock rod has a second abutting end and a second slot end, the second abutting end protrudes from the fourth side plate, and the pin is disposed through the second slot end; and a second push rod disposed on the fixing plate in a transversely slidable manner, wherein the second push rod has a second hook end and a second protruding-block end, a second inclined-surface structure and a second hook are formed on the second hook end, the second hook extends from the second inclined-surface structure to releasably hook the pin, and the second protruding-block end protrudes from the third side plate;

wherein when the first and second abutting ends abut against the first and second holding sheets respectively and the first and second blocks bias the first and second protruding-block ends respectively, the first and second hooks are separate from the pin, the first and second inclined-surface structures push the pin upward to the release position to drive the first and second lock rods to slide obliquely, and the first and second abutting ends retract inwardly to be separate from the first and second holding sheets.

12. The casing module of claim 1, wherein the first block has a first oblique surface, a second oblique surface is formed on the first protruding-block end corresponding to the first oblique surface, and when the first block biases the first protruding-block end, the first protruding-block end slides along the first oblique surface via the second oblique surface and the first push rod retracts inwardly relative to the fourth side plate.

13. The casing module of claim 12, wherein the first block further has a first vertical surface extending downward from the first oblique surface, a second vertical surface is formed on the first protruding-block end corresponding to the first vertical surface, and when the first protruding-block end retracts inwardly relative to the fourth side plate and the first vertical surface abuts against the second vertical surface, the first inclined-surface structure pushes the pin to the release position.

14. The casing module of claim 13, wherein the first block further has a third oblique surface extending downward from the first vertical surface, a fourth oblique surface is formed on the first protruding-block end corresponding to the third oblique surface, and when the first protruding-block end slides along the third oblique surface via the fourth oblique surface, the first push rod protrudes from the fourth side plate.

15. The casing module of claim 10, wherein the tray mechanism further comprises:
    a first spring connected to the sheet and the fixing plate for driving the sheet to move the pin to the lock position.

16. The casing module of claim 15, wherein the tray mechanism further comprises:
    a second spring connected to the first push rod and the fixing plate for moving the first push rod back to its original position to protrude the first protruding-block end from the fourth side plate.

17. The casing module of claim 10, wherein the first side plate further has a positioning rail, a positioning block is formed on the third side plate corresponding to the positioning rail, and when the first abutting end retracts inwardly and is separate from the first holding sheet, and the tray is configured to move downward into the casing, and the positioning block slides along the positioning rail to abut against a bottom of the positioning rail for positioning the tray in the casing.

18. The casing module of claim 10, wherein the sheet has at least one sliding slot, a sliding structure is formed on the fixing plate corresponding to the at least one sliding slot, and the sliding structure is slidably disposed through the at least one sliding slot to guide the sheet to slide upward and downward relative to the fixing plate.

* * * * *